United States Patent
Chung et al.

(10) Patent No.: US 7,615,499 B2
(45) Date of Patent: Nov. 10, 2009

(54) METHOD FOR OXIDIZING A LAYER, AND ASSOCIATED HOLDING DEVICES FOR A SUBSTRATE

(75) Inventors: Hin-Yiu Chung, Dornstadt (DE); Thomas Gutt, Hohenbrunn (DE)

(73) Assignee: Infineon Technologies AG, Munich (DE)

( * ) Notice: Subject to any disclaimer, the term of this patent is extended or adjusted under 35 U.S.C. 154(b) by 317 days.

(21) Appl. No.: 10/522,505

(22) PCT Filed: Jul. 26, 2003

(86) PCT No.: PCT/DE03/02523

§ 371 (c)(1), (2), (4) Date: Jan. 26, 2005

(87) PCT Pub. No.: WO2004/015754

PCT Pub. Date: Feb. 19, 2004

(65) Prior Publication Data

US 2006/0057858 A1    Mar. 16, 2006

(30) Foreign Application Priority Data

Jul. 30, 2002    (DE)    ............ 102 34 694

(51) Int. Cl.
*H01L 21/31*    (2006.01)
*H01L 21/469*    (2006.01)

(52) U.S. Cl. .............. 438/770; 438/463; 438/487; 438/940; 257/E21.079; 257/E21.282; 257/E21.301

(58) Field of Classification Search .......... 438/490, 438/261, 621, 463, 487, 535, 662, 770, 940; 432/241; 427/249.2; 257/E21.079, E21.267, 257/E21.282, E21.284, E21.301
See application file for complete search history.

(56) References Cited

U.S. PATENT DOCUMENTS 4,525,223 A * 6/1985 Tsuya et al. ............ 438/490

(Continued)

FOREIGN PATENT DOCUMENTS

DE    37 50 382 T2    3/1987

(Continued)

OTHER PUBLICATIONS

Spezialgraphite von SGL Carbon, Produkte für die Halbleitertechnik, SGL Carbon Group, pp. 2-17, Mar. 2001.

(Continued)

*Primary Examiner*—Leonardo Andújar
*Assistant Examiner*—Monica D Harrison
(74) *Attorney, Agent, or Firm*—Brinks Hofer Gilson & Lione

(57) ABSTRACT

A method is presented in which a layer which is to be oxidized is processed, in a single-substrate process. The process temperature during the processing is recorded directly at the substrate or at a holding device for the substrate. The method includes introducing a substrate, which bears a layer to be oxidized uncovered in an edge region in a layer stack, into a heating device, passing an oxidation gas onto the substrate, heating the substrate to a process temperature, which is recorded during the processing via a temperature of a holding device which holds the substrate, and controlling the substrate temperature to a desired temperature or temperature curve during the processing.

16 Claims, 3 Drawing Sheets

U.S. PATENT DOCUMENTS

Figure 1:
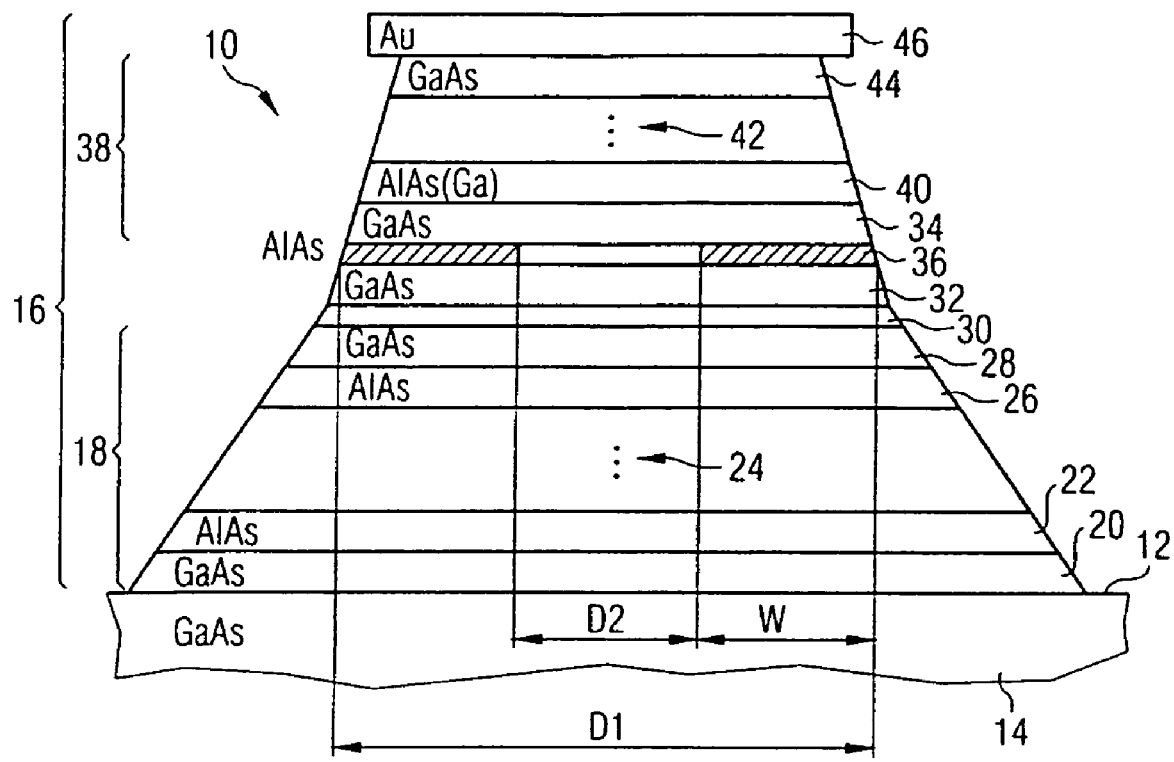

| | | | |
|---|---|---|---|
| 5,313,044 | A | 5/1994 | Massoud et al. |
| 5,385,866 | A | 1/1995 | Bartush |
| 5,411,763 | A * | 5/1995 | Weaver et al. ............ 427/249.2 |
| 5,581,571 | A | 12/1996 | Holonyak, Jr. et al. |
| 5,635,409 | A | 6/1997 | Moslehi |
| 5,749,723 | A * | 5/1998 | Okase ........................ 432/241 |
| 5,872,889 | A | 2/1999 | Kaltenbrunner et al. |
| 6,342,691 | B1 | 1/2002 | Johnsgard et al. |
| 6,566,199 | B2 * | 5/2003 | Tokai et al. ................. 438/261 |
| 2002/0026900 | A1 | 3/2002 | Huang et al. |

FOREIGN PATENT DOCUMENTS

| | | |
|---|---|---|
| DE | 689 19 408 T2 | 9/1989 |
| GB | 2 295 271 A | 5/1996 |
| GB | 2 355 850 A | 5/2001 |
| WO | WO 99/03141 | 1/1999 |

OTHER PUBLICATIONS

H.Q. Jia, H. Chen, W.C. Wang, W.X. Wang, W. Li, Q. Huang and Jiunming Zhou, *The Study of Thermal Stability During Wet Oxidation of AlAS*, Institute of Physics, Chinese Academy of Sciences, pp. 484-488, Journal of Crystal Growth, vol. 223, Issue 4, Mar. 2001.

William G. Breiland, Michael E. Coltrin, J. Randall Creighton, Hong Q. Hou, Harry K. Moffat and Jeffrey Y. Tsao, *Organometalic Vapor Phase Epitaxy*, Center for Compound Semiconductor Science and Technology, Sandia National Laboratories, Materials Science and Engineering: R. Reports, vol. 24, Issue 6, pp. 241-274, Feb. 1999.

International Search Report from International Application No. PCT/DE/02523, Jul. 26, 2003.

Examination Report from International Application No. PCT/DE/02523, Jul. 26, 2003.

* cited by examiner

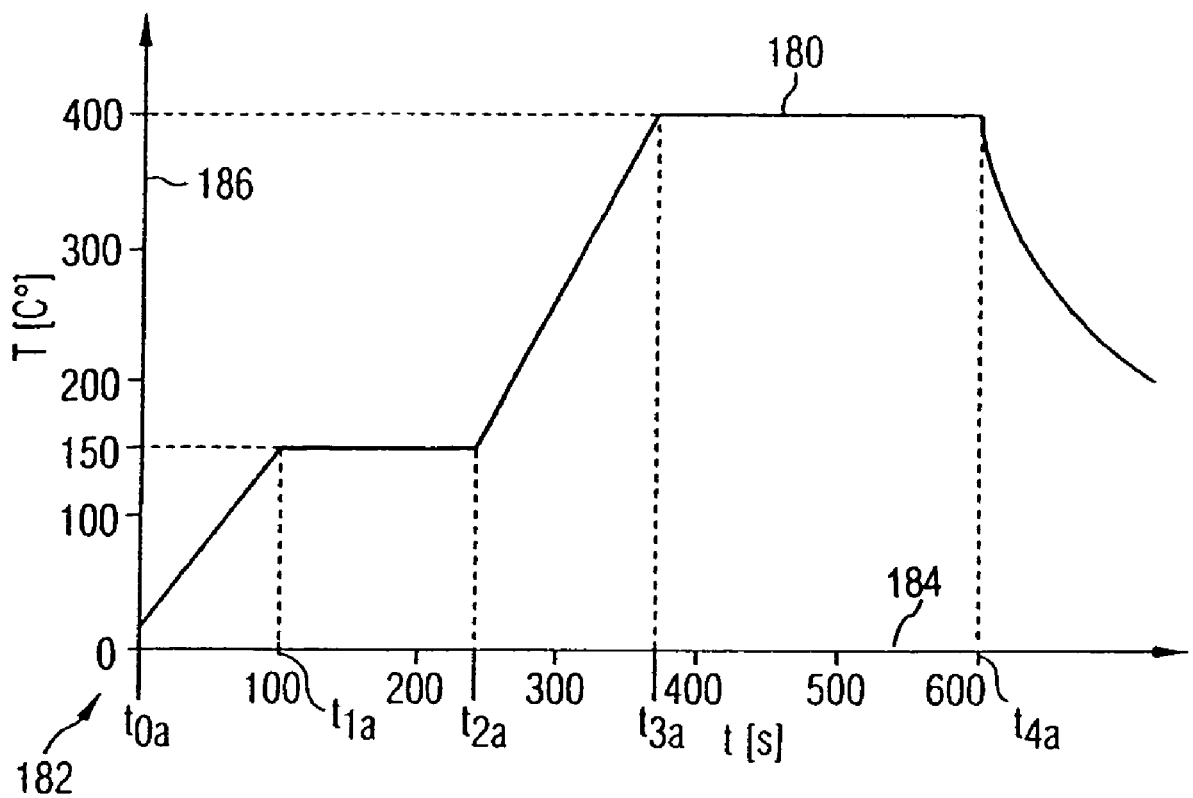
FIG 5
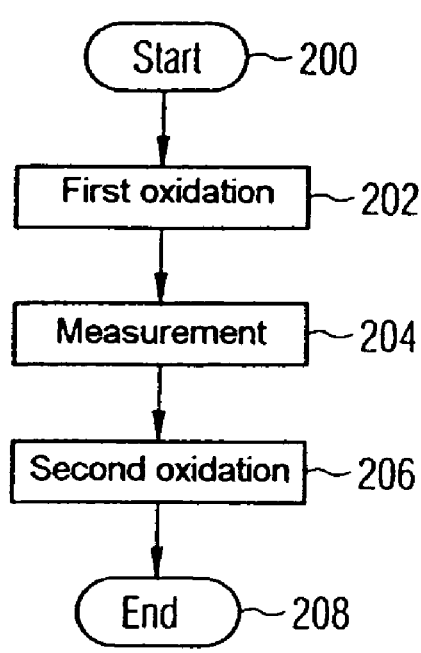
FIG 6
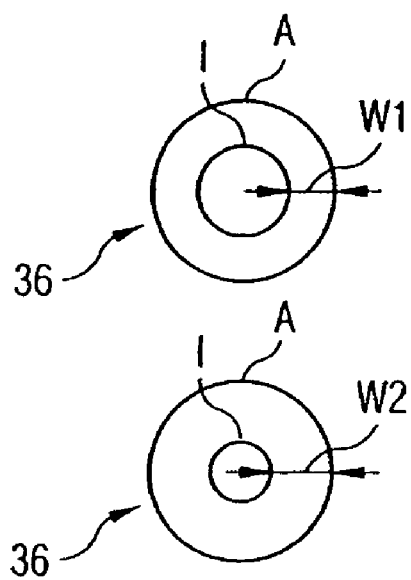

METHOD FOR OXIDIZING A LAYER, AND ASSOCIATED HOLDING DEVICES FOR A SUBSTRATE

This application is the national stage application of international application number PCT/DE2003/02523, filed on Jul. 26, 2003, which claims the benefit of priority to German Patent Application DE 10234694.1, filed on Jul. 30, 2002, incorporated herein by reference.

The invention relates to a method in which a substrate which bears a layer which is to be oxidized is provided. The layer which is to be oxidized is part of a layer stack which includes the substrate or a base layer at a base surface of the layer which is to be oxidized and a neighboring layer adjoining that surface of the layer to be oxidized which is remote from the base surface. The layer which is to be oxidized is uncovered in the edge region of the layer stack.

The mirror layers which are present in vertical semiconductor lasers form one example of a possible application for layer stacks of this type. Vertical semiconductor lasers are also known as VCSELs (vertical cavity surface emitting lasers). For this application, an aperture diaphragm is to be set in the layer which is to be oxidized by means of the oxidation and is used in particular also to predetermine a flow of current.

To oxidize the layer stack, the substrate which bears the layer stack has to be introduced into a heating device. The substrate is then purged with an oxidation gas and heated, for example, to a process temperature of between 100° C. (degrees Celsius) and 500° C. In an alternative procedure, the substrate is only purged with an oxidation gas at the process temperature (oxidation temperature).

Under the influence of the oxidation gas, the oxidation layer, as the oxidation time continues, is oxidized ever further from its edge into the layer stack at the process temperature. The oxidation width is decisively dependent on the process temperature. Even slight deviations in the process temperature from a desired temperature lead to considerable deviations in the oxidation width from a predetermined desired oxidation width.

It is an object of the invention to provide a simple method for oxidizing a layer of this type which in particular results in an oxidation width which corresponds as accurately as possible to a predetermined oxidation width. Moreover, it is intended to describe associated holding devices for a substrate.

In addition to the method steps described in the introduction, in the method according to the invention the substrate is preferably processed in a single-substrate process in the heating device. Moreover, during the processing the process temperature is recorded via the temperature at a holding device for the substrate. The holding device mainly contains a material with a high thermal conductivity at the process temperature.

The invention is based on the consideration that, in particular at process temperatures below 500° C., the thermal coupling between a furnace wall and the substrate which is to be processed is relatively weak. Therefore, in the process according to the invention, the process temperature is recorded not at the furnace wall, but rather via the temperature of the holding device. Moreover, on account of only one substrate being processed instead of a multiplicity of substrates, in a single-substrate process, in a refinement it is ensured that the thermal mass in the heating device is low. On account of this measure, the process temperature can be set very quickly and with little overshoot.

By using the method according to the invention, it is possible to oxidize oxidation layers with a high quality and an accurately predetermined oxidation width. Moreover, the processing of individual substrates remains economical, since on account of the fact that the oxidation width is highly dependent on the process temperature, the oxidation has ended within a few minutes.

On account of the use of a holding device it is possible, inter alia, to achieve a very homogenous temperature distribution at the substrate. This is a precondition for accurate temperature recording and therefore also for very accurate processing.

In a refinement of the method according to the invention, a deviation of 10° C. in the process temperature from a desired process temperature causes the oxidation width to deviate by more than 5%, by more than 10% or even by more than 20% from the desired oxidation width. Such temperature-dependent oxidation processes occur in particular in the oxidation of layers which contain semiconductor materials, for example gallium arsenide or silicon. In this case, the layer which is to be oxidized is doped, for example, with a metal, preferably with aluminum.

In one configuration, the substrate likewise contains gallium arsenide. In another configuration, the layer which is to be oxidized is arranged between two gallium arsenide layers. Gallium arsenide is a semiconductor material which is used in particular in optical semiconductor components, in particular in semiconductor lasers. If the oxidation of layers in this material is controlled, it is possible to produce high-quality optoelectronic components.

In another refinement of the method according to the invention, the thermal conductivity of the holding device at 20° C. is greater than 10 $Wm^{-1}K^{-1}$ (watts per meter and per Kelvin), preferably greater than 100 $Wm^{-1}K^{-1}$. This means that the thermal conductivity of the holding device is as good as with metals. However, the holding device itself does not have to be made from a metal. For example, in one configuration, a holding device which contains more than 90% of graphite and is preferably made from pressed graphite is used. Graphite has a good thermal conductivity in particular parallel to the layer planes of the graphite layers. In a further refinement, the escape of small graphite particles during the processing is prevented by a coating on the holding device. A particularly suitable coating is graphite which has been deposited with the aid of a CVD (chemical vapor deposition) process.

In a further refinement, the heat-up time of the heating device from the start of the heating operation for heating up the substrate until the process temperature is reached at the substrate is less than five minutes. Such a short heat-up time is made possible by the low thermal mass and by the direct recording of the process temperature at the substrate and/or at the holding device. The process temperature is preferably between 350° C. and 450° C. If a temperature of less than 50° C. prevails in the heating device at the start of the heating operation, this means that the temperature in the heating device rises by more than 300° C. during the heat-up time. Heating devices which allow temperature rises of greater than 40° C. and up to 50° C. per second are used, with the deviation from a predetermined temperature curve being less than 5° C. (degrees Celsius) or less than 1° C.

The residence time of the substrate in the heating device is in one refinement less than fifteen minutes, in particular less than ten minutes. Therefore, the method according to the invention qualifies as a so-called RTP (rapid thermal processing) process. Suitable heating devices for methods of this type allow, for example:

the silicon wafer to be heated up between two heated graphite plates (rapid isothermal annealing), or the silicon wafer to be heated up by high-power lamps, in particular halogen lamps (rapid optical annealing).

In a further refinement of the method according to the invention, during the heating of the substrate up to the process temperature, at least one preheating step is carried out, in which the temperature in the heating device is held for at least ten seconds or at least thirty seconds at a preheating temperature which is lower than the process temperature and higher than a condensation temperature of the oxidation gas, e.g. of steam. If water molecules are used as carrier medium, the preheating temperature is, for example, 150° C. The preheating ensures that the oxidation gas, in particular water, is not absorbed or is not absorbed to the same extent by the holding device. Absorption of this nature would have adverse effects on the procedure. In a refinement, the oxidation gas is introduced into the heating device at atmospheric pressure.

In a further refinement, the holding device is covered by a cover. The cover rests on the edge of the holding device or is arranged at a predetermined distance from the edge, so that a gap forms between cover and edge of the holding device. If the cover is resting on the holding device, the oxidation gas can nevertheless reach the substrate on account of the roughness of the cover and of the holding device.

The use of a cover makes it possible to counteract what is known as the "pattern" effect, whereby temperatures which differ from one another during processing with a radiation heating installation occur at locations with different materials or with different structures of the substrate.

In a further refinement, the heating device includes straight heating elements. The substrate has a circular base surface, as is the case, for example, with a circular semiconductor wafer. The holding device includes, in the circumferential direction of the substrate circumference, a recess into which a ring made from a material which differs from the material of the holding device, e.g. made from silicon, silicon carbide, quartz or gallium arsenide, is introduced, preferably exchangeably. By suitably selecting the ring material, it is possible to achieve a uniform temperature distribution over the entire substrate surface during the processing.

This refinement is based on the consideration that although heating lamps of the heating device can be controlled individually, a radially symmetrical heat distribution cannot be achieved by targeted actuation of straight lamps. A more uniform distribution of heat can only be achieved by using the radially symmetrical ring. The thermal mass of the box can be altered in a manner which is suitable for the process by introducing the ring. By exchanging rings, it is possible to adapt to different substrates and to different process conditions. In one configuration, there is a plurality of rings of different thickness made from the same material.

In another refinement of the method according to the invention, the heating device is suitable for heating rates of greater than 8° C. per second. The layer stack includes a layer which projects beyond the edge of the stack, preferably a contact-making layer for making contact with the semiconductor component which is to be fabricated. Nevertheless, during heating up to the process temperature, a heating rate of less than 6° C. per second or less than 3° C. per second is used. This measure ensures that, in particular in the case of a layer of gold projecting beyond the edge, the layer of gold is prevented from drooping at the edge. This means that the entire contact layer continues to be available for making contact with an electrical contact. If, in a different procedure, a contact layer which projects laterally beyond the layer stack is not used, higher heat-up rates than 8° C. per second are used.

In another refinement, the oxidation is interrupted before a desired oxidation width is reached. The oxidation width is recorded and a post-oxidation is carried out as a function of the recorded oxidation width. By means of this procedure, it is possible to draw conclusions as to parameters which are critical for oxidation, e.g. the metal content of the layer which is to be oxidized or the actual starting size of the diaphragm to be produced. These conclusions or even the recorded values can be used to adjust the process time for a second oxidation step for further oxidation of the same oxide layer. In this way, the oxidation width can be set very accurately, i.e. to a predetermined target depth.

In a refinement of the method according to the invention, the oxidation gas contains oxygen only in bonded form, preferably bonded in $H_2O$ molecules. The proportion of oxygen molecules $O_2$ during the processing is kept at lower than 1%, preferably even less than 0.01%, based on the number of molecules per unit volume, since otherwise the oxidation of the layer to be oxidized into the layer stack would be stopped. This may be attributable to the fact that the pure oxygen effects a different oxidation at the edge of the layer to be oxidized, and this different oxidation, unlike the oxidation using bonded oxygen, prevents oxygen from penetrating into the oxidation layer.

In another refinement, the temperature is recorded using a pyrometer or using at least one thermocouple on which the substrate or the holding device rests. Said components are eminently suitable for accurate temperature measurement.

The invention also relates to the use of the method according to the invention for fabricating an electronic semiconductor component with electronic contacts. Surprisingly, it has been found that in the procedure according to the invention the contact resistance is less than $5 \times 10^{-7}$ $\Omega/cm^{-2}$ (ohms per square centimeter) or even less than $4 \times 10^{-6}$ $\Omega/cm^{-2}$. Therefore, an electronic characteristic variable which is of crucial importance to the semiconductor component is well below the value of, for example, 6 to $9 \times 10^{-6}$ $\Omega/cm^{-2}$ which has previously been achieved. The contact resistances are of considerably importance for short switching times in particular in integrated vertical lasers units, e.g. in laser units with switching times of greater than one gigabit per second or greater than 2.5 gigabits per second.

The invention also relates to holding devices having the abovementioned properties. The technical effects described above therefore also apply to the holding devices on their own.

The methods referred to above as refinements, with a preheating step, and the method involving an interruption to the oxidation before a desired oxidation width is reached, are also used in procedures which differ from the procedure according to the invention, for example with regard to the process temperature, with regard to the recording of the process temperature and/or with regard to the controlling of the temperature of the substrate.

Figure 2:
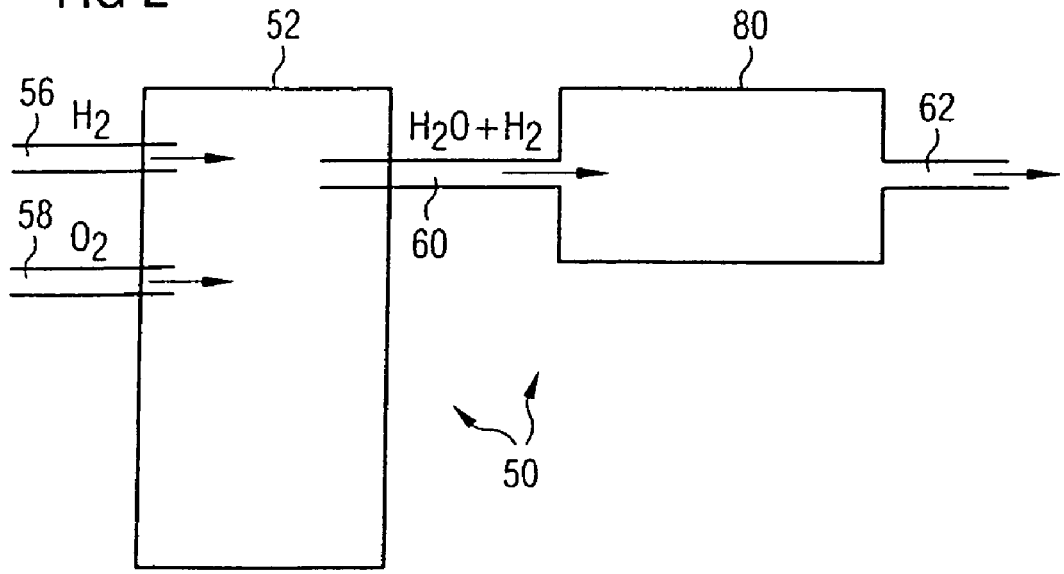
Figure 3:
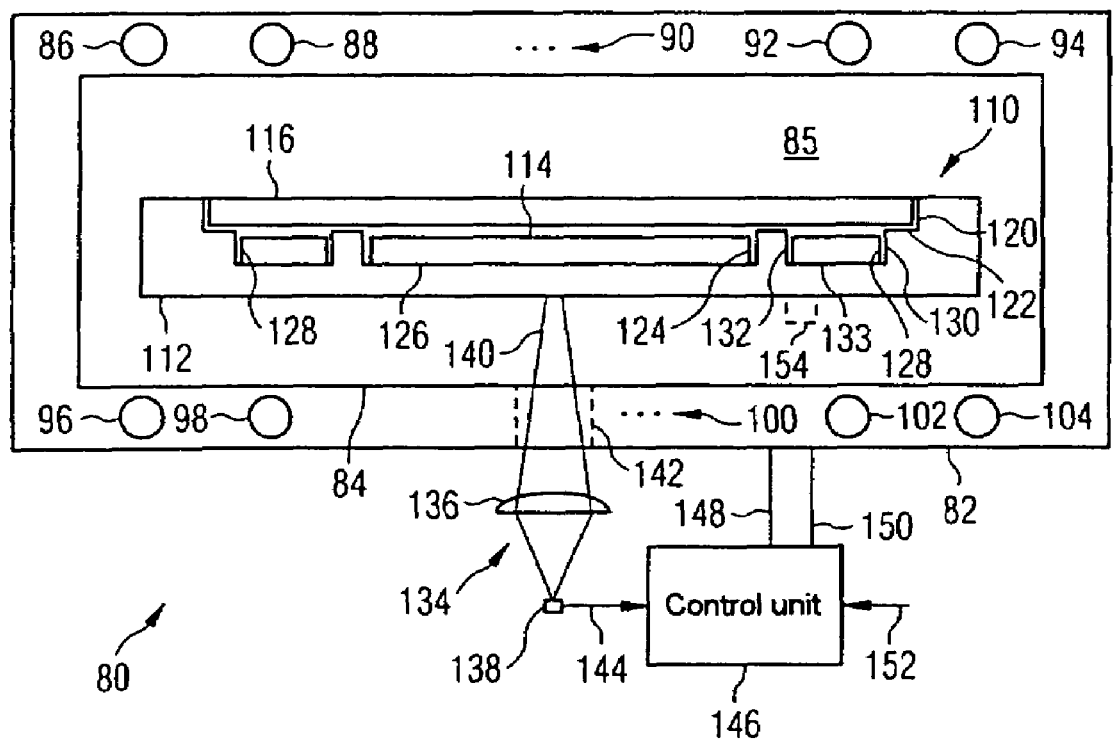
Figure 4:
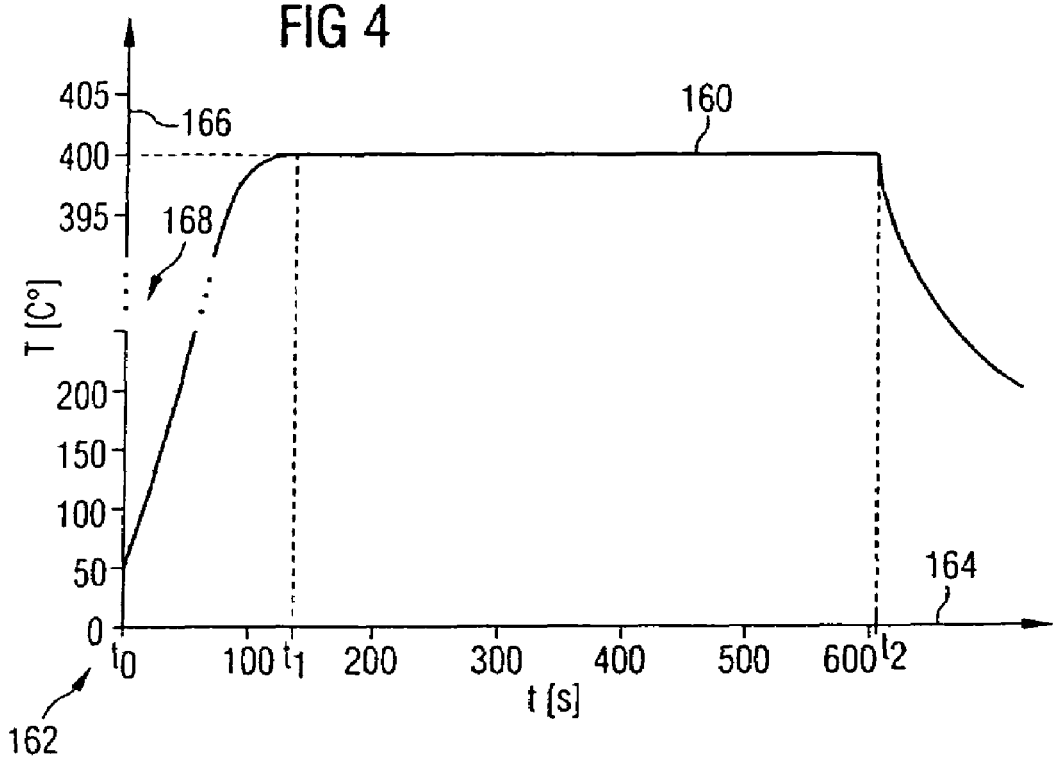

Exemplary embodiments of the invention are explained on the basis of the appended drawings, in which:

FIG. 1 shows a cross section through a vertical semiconductor laser having an aperture diaphragm which is to be oxidized, FIG. 2 shows an installation for carrying out the oxidation, FIG. 3 shows the structure of a heating device, FIG. 4 shows a temperature curve at the substrate without a preheating step being carried out, FIG. 5 shows a temperature curve at the substrate with a preheating step being carried out, and FIG. 6 shows method steps in a method with interrupted oxidation.

FIG. 1 shows a cross section through a vertical semiconductor laser 10, in which a laser beam emerges in a direction which is normal to a substrate surface 12 of a semiconductor substrate 14, which in the exemplary embodiment consists of the compound semiconductor gallium arsenide. The laser beam has a wavelength of, for example, 890 nanometers.

The semiconductor laser 10 is formed by a layer stack comprising a multiplicity of layers which are explained in more detail below. For example, starting from the substrate 14, the following layers are present in a half 18 of the layer stack 16 which is close to the substrate:

a bottom gallium arsenide layer 20,
a bottom aluminum arsenide layer 22,
a layer sequence 24 which is indicated by dots and alternately comprises a gallium arsenide layer, an aluminum arsenide layer, a gallium arsenide layer, etc.,
a top aluminum arsenide layer of the half 18 close to the substrate, and
a top gallium arsenide layer 28 of the half 18 close to the substrate.

On account of the different refractive indices of gallium arsenide layers and aluminum arsenide layers, the layers 20 to 28 form what are known as Bragg reflectors. By way of example, the half 18 close to the substrate includes ten Bragg reflectors.

In the middle of the layer stack 16 there is at least one so-called quantum film 30 between the gallium arsenide layer 28 and a gallium arsenide layer 32. The gallium arsenide layer 32 and a further gallium arsenide layer 34 enclose an aperture layer 36 which originally consists of an arsenide layer doped with aluminum. During the course of an oxidation step, which is explained in more detail with reference to FIGS. 2 to 6, the aluminum which is contained in the aperture layer 36 is oxidized, so that an aperture diaphragm is formed with an external diameter D1 which corresponds to the diameter of the layer stack 16 at the height of the aperture layer 36. The internal diameter D2 of the aperture diaphragm is dependent on the oxidation width W or the oxidation depth in the lateral direction of the layer stack 16.

The gallium arsenide layer 34 forms the bottom layer of a half 38 of the layer stack 16 which is remote from the substrate. Starting at the gallium arsenide layer 34, the half 38 remote from the substrate starts with an aluminum arsenide layer 40, followed by a layer sequence 42, in which a gallium arsenide layer, an aluminum arsenide layer, a gallium arsenide layer, etc. alternate, and
a top gallium arsenide layer 44 of the half 38 remote from the substrate, which adjoins the final aluminum arsenide layer of the layer sequence 42. On account of their different refractive indices, the layers of the half 38 remote from the substrate likewise form what are known as Bragg reflectors, e.g. ten reflectors.

On top of the gallium arsenide layer 44 there is a contact layer 46 made from gold, the edge of which projects beyond the layer stack 16 over the entire circumference of the layer stack 16. The fact that the contact layer 46 projects in this way ensures that better contact is made with a contact which is to be applied to the contact layer 46.

The Bragg reflector structures of the layer stack 16 can be produced, for example, by means of molecular beam epitaxy from [100] oriented gallium arsenide wafers. The layer thickness of a gallium arsenide layer or of an aluminum arsenide layer is, for example, 141 nm (nanometers). In the exemplary embodiment, the diameter D1 is 35 μm (micrometers), and the diameter D2 is 13 μm. The aperture layer 36 has a thickness of, for example, 30 nm prior to the oxidation.

Oxidation of the aluminum arsenide layers of the half close to the substrate and of the half 38 remote from the substrate can be prevented, for example, by adding gallium to these layers. However, it is also possible to take other measures to prevent oxidation, for example partial resist coatings.

FIG. 2 shows an installation 50 which is used to carry out the oxidation of the aperture layer 36. The installation 50 includes a burning unit 52 and a heating device 80.

The burning unit 52 has an inlet 56 for the admission of hydrogen $H_2$ and an inlet 58 for the admission of pure oxygen $O_2$. In the burning unit 52, the hydrogen and oxygen are burnt in a heated burner tube, forming steam. Of course, the steam can also be produced in other ways, e.g. by the evaporation of water.

The steam and a predetermined quantity of hydrogen pass out of the burning unit 52 via a connecting tube 60 into the heating device 80, the structure of which is explained in more detail below with reference to FIG. 3. The heating device 80 has an outlet 62, through which the reaction vapors can emerge from the heating device 80. A reaction equation for the oxidation in the heating device 80 reads as follows:

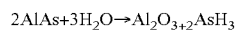

$$2AlAs + 3H_2O \rightarrow Al_2O_{3+2}AsH_3$$

FIG. 3 shows the structure of a heating device 80 which is surrounded by a cuboidal reflector wall 82 which is coated with a material with a high degree of radiation reflection at the inner side. Inside the reflector wall 82 there is a cuboidal heating chamber wall 84 made from a material which readily transmits the thermal radiation of halogen lamps, e.g. from quartz glass. Halogen heating lamps 86 to 104 are arranged between the chamber wall 84 and the reflector wall 82, above a heating chamber 85 and below the heating chamber 85. The longitudinal axes of the straight halogen heating lamps are arranged in the longitudinal direction of the cuboidal heating device 80.

Inside the chamber wall 84, on a retaining device (not shown), there is a graphite box 110 in disk form with a circular base surface 112. In an alternative exemplary embodiment, the base surface is square or rectangular. The graphite box 110 is used to hold a semiconductor wafer 114 which, for example, includes the semiconductor substrate 14. The graphite box 110 is closed by a graphite cover 116, diffusion of the oxidation gas being possible through spaces which are present between the graphite box 110 and the graphite cover 116 on account of the roughness of the material.

The graphite box 110 includes a recess for holding the graphite cover 116. This recess is laterally delimited by a stop face 120 which runs along the circumference of a circle. A bearing surface 122 on which the graphite cover 116 rests is positioned transversely with respect to the stop face 120. In the exemplary embodiment, the stop face 120 is at an angle of 90° with respect to the base surface 112. In another exemplary embodiment, the stop face 120 is inclined, in order to make it easier to insert the graphite cover 116.

Moreover, the graphite box 116 has a central recess for holding the semiconductor wafer 114. The central recess has a lateral stop face 124 which lies along the circumference of a circle, if appropriate with the exception of a section which is matched to a flat on the semiconductor wafer 114. In the exemplary embodiment, the stop face 124 lies at right angles to the base surface 112. In another exemplary embodiment, the stop face 124 is inclined in order to facilitate the insertion of the semiconductor wafer 114.

Moreover, the central recess includes a planar bearing surface 126, on which the underside of the semiconductor wafer 114 rests over a large surface area. In addition or as an alternative, the distance between bearing surface and underside may be less than one millimeter or less than 0.5 millimeter, e.g. 100 micrometers. Such narrow gap widths lead to a high level of heat convection, which in terms of the thermal coupling has the same effect as a high thermal conductivity.

An annular recess for holding an insert ring 128, which consists, for example, of silicon, silicon carbide or another suitable material, is present between the central recess and the bearing surface 122 for the graphite cover 116.

The annular recess has an outer stop face 130 which runs along the circumference of a circle and in the exemplary embodiment is perpendicular to the base surface 112. An inner stop face 132 of the annular recess lies along the circumference of a concentric circle with a smaller diameter than the circle along whose circumference the outer stop face 130 lies. The inner stop face 132 is likewise at an angle of 90° with respect to the base surface 112. In another exemplary embodiment, the outer stop face 130 is inclined outward and the inner stop face 132 is inclined inward, in order to make it easier to insert the insert ring 128. At the bottom of the annular recess there is a planar bearing surface 133. The bearing surfaces 122, 126 and 133 lie parallel to the base surface 112.

The graphite box 110 illustrated in FIG. 3 has an annular projection between the central recess and the annular recess. The projection is laterally delimited by the stop face 124 and by the inner stop face 132. In another exemplary embodiment, the graphite box 110 has no such projection, meaning that the semiconductor wafer 14 and the insert ring are separated only by a gap. An insert ring which corresponds to the insert ring 128 in this case has an internal radius which is only slightly larger than the external radius of the semiconductor wafer 114, for example only one or two millimeters larger.

The heating chamber 80 illustrated in FIG. 3 is, for example, suitable for processing semiconductor wafers 114 with a diameter of four inches (1 inch=25.4 mm). However, there are also heating chambers 80 for semiconductor wafers with a diameter which is greater than or less than four inches.

In a first variant, a pyrometer 134 is used to record the temperature T at the base surface 112 of the graphite box 110 and therefore also the temperature T of the semiconductor wafer 114. The pyrometer 134 includes a system of lenses 136 and is used to record the heat which is irradiated from the base surface 112 by measuring the radiation intensity at a set frequency or within a set frequency range with the aid of a radiation sensor 138, e.g. an infrared sensor. Moreover, FIG. 3 illustrates the beam path 140 of the pyrometer 134. The beam path 140 crosses a window 142, which transmits the radiation, in the center of the base of the chamber wall 84 and of the reflector wall 82. In other exemplary embodiments, the pyrometer 134 is arranged elsewhere, for example also inside the reactor chamber 84 and/or with a lateral offset with respect to the center axis of the semiconductor wafer 114.

Lines 114 lead from the radiation sensor 138 to a control unit 146 for controlling the temperature T in the heating chamber 80. The control unit 146 operates, for example, with the aid of a microprocessor, which carries out a PID (proportional integral differential) control. However, open-loop control units are also used. Power supply lines 148, 150 lead from the control unit 146 to the halogen heating lamps 86 to 104. The heating power of the halogen heating lamps 86 to 104 can be controlled by setting the heating current. Moreover the control unit 146 has an input feature 152, which is illustrated by an arrow, for setting a desired temperature curve. The temperature curve can be selected, for example, by setting times and associated temperatures in a data file.

In another exemplary embodiment, a thermocouple 154, which bears against the base surface 122 of the graphite box 110 in the center or offset from the center, is used instead of the pyrometer 134. The temperature is preferably recorded in a central region of the base surface 112.

FIG. 4 shows a temperature curve 160 recorded at the base surface 112. The temperature curve 160 is represented in a system of coordinates 162 which includes an x-axis 164, on which the time t in a range from zero seconds to approximately 700 seconds is plotted. A y-axis 166 is used to represent the temperature T in a range from 0° C. to approximately 400° C. The y-axis 166 is interrupted in a central region 168 in order to be able to increase the resolution in the upper temperature range.

The semiconductor substrate 14 is placed into the graphite box 110 and introduced into the heating chamber 80. In another exemplary embodiment, the substrate is introduced into the graphite box inside the heating chamber 80. At this time, the graphite box 110 is at a temperature of, for example, approximately 50° C. The heating chamber is then purged with nitrogen.

Then, the oxidation gas is introduced into the heating chamber 80.

In a heat-up phase between a time t0 and a time t1 at approximately 130 seconds, the graphite box 110 and therefore also the semiconductor substrate 14 is then heated to a temperature of 400° C. On account of the temperature being recorded at the base surface 112 and of suitable control constants being selected, the temperature curve 160 does not significantly overshoot the temperature value 400° C.

The oxidation of the aperture layer 36 commences at approximately 390° C., starting from the edge and progressing toward the interior of the layer stack 16. As the oxidation time increases, the oxidation width W grows. At a time t2 at approximately 600 seconds, the aperture has an internal diameter D2, i.e. the desired internal diameter. The halogen heating lamps 86 to 104 are switched off, so that the graphite box 110 can cool rapidly. At a temperature below, for example, 350° C., the heating chamber 85 is purged with inert gas if the oxidation gas contains molecular hydrogen.

When the graphite box 110 has reached a temperature of approximately 200° C., it is removed from the heating chamber 80. The entire operation of processing the semiconductor wafer 14 is shorter than fifteen minutes. In another exemplary embodiment for a semiconductor laser without a contact edge projecting beyond the stack, the heat-up rate is more than twice as high, for example three times as high.

FIG. 5 shows a temperature curve 180 for processing of, for example, a semiconductor wafer 14 which bears a projecting contact edge, including a preheating step. The temperature curve 180 is shown in a system of coordinates 182 which has an x-axis 184 representing the process time t in a range from zero seconds to approximately 700 seconds. A y-axis 186 of the system of coordinates 182 is used to represent the temperature T in the heating chamber 80 in a temperature range from 0° C. to 400° C.

The graphite box 110 is introduced into the heating chamber 80 together with the semiconductor substrate 14. This is followed by purging with nitrogen or another inert gas. Then, steam is introduced. In the case of the exemplary embodiment explained with reference to FIG. 5, the graphite box 110 is at room temperature, 20° C., at time t0. Starting at time t0a, through to time t1a at 100 seconds, the temperature T in the heating chamber 80 is increased in linear fashion up to a preheating temperature VT of 150° C. For a time between time t1a and a time t2a at approximately 250 seconds, the temperature remains at the value of 150° C.

During a second heat-up phase, the temperature T in the heating chamber, starting from time t2a through to a time t3a at approximately 380 seconds, increases, for example in linear fashion, from the temperature value 150° C. to the temperature value 400° C. On account of the presence of the oxidation gas, the oxidation begins even during the second heat-up phase.

Between time t3a and a time t4a at approximately 600 seconds, the temperature of the graphite box 110 in the heating chamber 80 and in particular at the base surface 112 remains constant at the temperature value T of 400° C. In the time between times t3a and t4a, the aperture layer 36 is oxidized further until the oxidation width W has been reached.

At time t4a, the halogen heating lamps 86 to 104 are switched off, so that the heating chamber 80 is rapidly cooled again. Then, the graphite box 110 is removed from the heating chamber 80. Alternatively, the temperature is reduced in controlled fashion.

FIG. 6 shows method steps of a method with interrupted oxidation. The method starts in a method step 200 with the introduction of the substrate 14 into the heating chamber 80. In a subsequent method step 202, the aperture layer 36 is oxidized to a width W1 which is less than the oxidation width W. The oxidation is carried out, for example, using the temperature curve 160 which has been explained with reference to FIG. 4. However, the oxidation is interrupted after a process time t=350 seconds. The graphite box 110 cools down and is then removed from the heating chamber 80.

With the aid of a measuring device, the aperture layer 36 is measured in a method step 204, with the oxidation width W1 between an outer edge A and an inner edge I of the aperture diaphragm in the aperture layer 36 being determined. By way of example, the measuring device includes an infrared microscope. Then, starting from the measured width W1, a post-oxidation time tr for the remaining oxidation is determined.

In a method step 206, the partially oxidized aperture layer 36 is introduced back into the heating chamber 80 and heated to the oxidation temperature of 400° C., in order to carry out a remaining oxidation for the calculated post-oxidation time tr. After the post-oxidation time tr has ended, the oxidation is ended and the halogen heating lamps 86 to 104 are switched off.

After the semiconductor substrate 14 has been removed from the graphite box 110, the method ends at a method step 208. The aperture diaphragm in the aperture layer 36 now has an inner edge I whose diameter corresponds to the diameter D2. An oxidation width W2 between the outer edge A and the inner edge I corresponds to the desired oxidation width W.

In another exemplary embodiment, the method which has been explained with reference to FIG. 6 is carried out using the temperature curve explained with reference to FIG. 5 in method step 202 and/or method step 206.

The post-oxidation option is based on the fact that the oxidation edge in the aperture layer 36 when the substrate is removed from the heating chamber 80 in method step 202 is then at a temperature which is so "low" that the aperture diaphragm still consists of hydroxides, which can be post-oxidized without major problems.

LIST OF REFERENCE SYMBOLS

10 Semiconductor laser
12 Substrate surface
14 Semiconductor substrate
16 Layer stack
18 Half close to the substrate
20 Gallium arsenide layer
22 Aluminum arsenide layer
24 Layer sequence
26 Aluminum arsenide layer
28 Gallium arsenide layer
30 Quantum film
32, 34 Gallium arsenide layer
36 Aperture layer
D1 Outer diameter
D2 Inner diameter
W Oxidation width
38 Half remote from the substrate
40 Aluminum arsenide layer
42 Layer stack
44 Gallium arsenic layer
46 Contact layer
50 Installation
52 Burning unit
56, 58 Inlet
60 Connecting tube
62 Outlet
80 Heating device
82 Reflector wall
84 Chamber wall
85 Heating chamber
86 to 104 Halogen heating lamp
110 Graphite box
112 Base surface
114 Semiconductor wafer
116 Graphite cover
118 Gap
120 Bearing surface
122 Stop face
124 Stop face
126 Bearing surface
128 Insert ring
130 Outer stop face
132 Inner stop face
133 Bearing surface
134 Pyrometer
136 system of lenses
138 Radiation sensor
140 Radiation
142 Window
144 Line
146 Control unit
148, 150 Power supply line
152 Input feature
154 Thermocouple
160 Temperature
162 System of coordinates
164 x-axis
t Time
166 y-axis
T Temperature
168 Middle region
t0 to t2 Times
180 Temperature curve
182 System of coordinates
184 x-axis
186 y-axis
t0a to t4a Times
200 Start
202 First oxidation
204 Measurement
206 Second oxidation
208 End
W1, W2 Oxidation width
A Outer edge
I Inner edge

The invention claimed is:

1. A method for oxidizing a layer, comprising the following steps, carried out without restriction in the order indicated:
providing a substrate, which bears a layer of a vertical cavity surface emitting laser which is to be oxidized, the layer which is to be oxidized being part of a layer stack which includes the substrate or a base layer at a base surface of the layer which is to be oxidized, and a neighboring layer which adjoins a surface of the layer to be oxidized which is remote from the base surface, and the layer which is to be oxidized being uncovered in an edge region of the layer stack;
introducing the substrate which bears the layer stack into a holding device;
introducing the holding device into a heating device;
passing an oxidation gas onto the substrate;
heating the substrate to a process temperature, the layer which is to be oxidized, as the oxidation time continues, being oxidized ever further from an edge into the layer stack under the influence of the oxidation gas at the process temperature,
recording a temperature of the holding device, where the process temperature during the processing being the temperature of the holding device, or recording the temperature of the substrate; and
controlling the temperature of the substrate to a predetermined desired temperature or a predetermined desired temperature curve during the processing.

2. The method as claimed in claim 1, wherein at least one of:
a main surface of the substrate contacts a main surface of the holding device or is arranged at a distance of less than three millimeters from the main surface of the holding device,
a 10° C. deviation in the process temperature causes an oxidation width to deviate by more than 5%,
the layer which is to be oxidized contains a semiconductor material which is doped with a metal,
the substrate contains gallium arsenide,
the layer which is to be oxidized is arranged between two layers which are not to be oxidized during the processing,
the process temperature is between 100° C. and 500° C.,
in which the oxidation width is dependent on the process temperature,
and in which the substrate is processed in a single-substrate process in the heating device.

3. The method as claimed in claim 1, wherein a heat-up time of the heating device from a start of a heating operation until the process temperature is reached is less than five minutes, the process temperature is between 350° C. and 450° C., and at least one of:
a temperature of less than 50° C. prevails in the heating device at the start of the heating operation,
and a residence time of the substrate in the heating device is less than fifteen minutes.

4. The method as claimed in claim 1, wherein during the heating of the substrate to the process temperature at least one preheating step is carried out, in which the temperature in the heating device is held at a preheating temperature, which is lower than the process temperature and higher than a condensation temperature of the oxidation gas or a gas which has been admixed with the oxidation gas, for at least ten seconds,
and wherein the oxidation gas starts to be admitted to the heating device before the preheating temperature is reached or at the preheating temperature.

5. The method as claimed in claim 1, wherein at least one of: the holding device is covered by a cover and the cover rests on an edge of the holding device or is held at a predetermined distance from the edge.

6. The method as claimed in claim 1, wherein the substrate comprises a circular base surface, and at least one of:
the holding device, in a circumferential direction of the substrate, comprises a recess into which a ring is placed,
and the heating device includes straight heating elements or spot-like heating elements.

7. The method as claimed in claim 1, wherein the heating device can achieve heating rates of greater than 8° C. per second,
wherein the layer stack includes a layer whose edge projects beyond the stack,
and wherein the heating-up to process temperature is carried out at a heating rate of less than 6° C. per second.

8. The method as claimed in claim 1, further comprising interrupting the oxidation before a desired oxidation width is reached;
recording an oxidation width;
performing a post-oxidation of the layer which is to be oxidized as a function of the recorded oxidation width.

9. The method as claimed in claim 1, wherein the oxidation gas contains oxygen in a form bonded to at least one other element,
and wherein the level of molecular oxygen during processing is less than 1%.

10. The method as claimed in claim 1, wherein the temperature of the holding device is recorded using a pyrometer or using at least one thermocouple.

11. The method as claimed in claim 1, in which the vertical cavity surface emitting laser comprises electrical contacts,
a contact resistance of the electrical contacts being less than 5 times $10^{-6}$ $\Omega$/cm$^{-2}$ or being lower than the contact resistance which is produced in a conventional furnace process using otherwise identical materials.

12. The method as claimed in claim 1, wherein the holding device comprises a graphite box and a graphite cover, and where introducing the substrate which bears the layer stack into the holding device comprises placing the substrate in the graphite box and covering the graphite box with the graphite cover.

13. The method as claimed in claim 12, wherein the graphite box comprises at least ninety-percent graphite.

14. A method for oxidizing a layer, comprising the following steps, carried out without restriction in the order indicated:
providing a substrate, which bears a layer which is to be oxidized, the layer which is to be oxidized being part of a layer stack which includes the substrate or a base layer at a base surface of the layer which is to be oxidized, and a neighboring layer which adjoins a surface of the layer to be oxidized which is remote from the base surface, and the layer which is to be oxidized being uncovered in an edge region of the layer stack;
introducing the substrate which bears the layer stack into a holding device;
introducing the holding device into a heating device;
passing an oxidation gas onto the substrate;
heating the substrate to a process temperature, where the process temperature is reached at a first process time, and where the layer which is to be oxidized, as the oxidation time continues, being oxidized ever further from an edge into the layer stack under the influence of the oxidation gas at the process temperature;

interrupting the heating of the substrate at a second process time, where the second process time is after the first process time;
recording an oxidation width of the layer to be oxidized;
determining a post-oxidation process time as a function of the recorded oxidation width;
reintroducing the holding device into the heating device;
reheating the substrate to the process temperature;
maintaining the reheated substrate at the process temperature for the post-oxidation process time; and
recording the process temperature during the processing and during the post-oxidation by recording a temperature of the holding device.

15. The method of claim 14, where interrupting the heating of the substrate comprises:
cooling the holding device at the second process time; and
removing the holding device from the heating device.

16. The method of claim 14, where the second process time is approximately 350 seconds.

* * * * *